US008756208B2

(12) United States Patent
Franke et al.

(10) Patent No.: US 8,756,208 B2
(45) Date of Patent: Jun. 17, 2014

(54) ENCODED DATA PROCESSING

(75) Inventors: Hubertus Franke, Cortlandt Manor, NY (US); Balakrishna R. Iyer, San Jose, CA (US); Hong Min, Poughkeepsie, NY (US); Terence P. Purcell, Springfield, IL (US); Guogen Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/545,522

(22) Filed: Jul. 10, 2012

(65) Prior Publication Data

US 2014/0019472 A1 Jan. 16, 2014

(51) Int. Cl.
*G06F 17/00* (2006.01)
*G06F 17/30* (2006.01)

(52) U.S. Cl.
CPC .............................. *G06F 17/30076* (2013.01)
USPC ....................................................... 707/693

(58) Field of Classification Search
CPC ..... G06F 17/30; G06F 17/067; G06F 17/076; G06F 17/286; G06F 17/289; G06F 17/292
USPC ................................................. 707/769, 693
See application file for complete search history.

(56) References Cited

U.S. PATENT DOCUMENTS

| | | | |
|---|---|---|---|
| 5,897,641 A | 4/1999 | Ruddy et al. | |
| 2003/0090397 A1 | 5/2003 | Rasmussen | |
| 2004/0068715 A1* | 4/2004 | Wong et al. | 717/136 |
| 2004/0103087 A1* | 5/2004 | Mukherjee et al. | 707/3 |
| 2006/0136365 A1 | 6/2006 | Kedem et al. | |
| 2006/0136508 A1* | 6/2006 | Idicula et al. | 707/203 |
| 2006/0233237 A1* | 10/2006 | Lu et al. | 375/240.03 |
| 2006/0233245 A1* | 10/2006 | Chou et al. | 375/240.12 |
| 2007/0002946 A1* | 1/2007 | Bouton et al. | 375/240.01 |
| 2008/0294863 A1 | 11/2008 | Faerber et al. | |
| 2009/0106281 A1 | 4/2009 | Marwah et al. | |
| 2010/0030748 A1 | 2/2010 | Netz et al. | |
| 2010/0030796 A1 | 2/2010 | Netz et al. | |
| 2010/0036861 A1 | 2/2010 | Srihari et al. | |
| 2010/0070535 A1 | 3/2010 | Irun-Briz et al. | |
| 2010/0228800 A1 | 9/2010 | Aston et al. | |
| 2010/0241615 A1 | 9/2010 | Marshall et al. | |
| 2010/0241616 A1 | 9/2010 | Murphy et al. | |
| 2010/0278446 A1 | 11/2010 | Ganesh et al. | |
| 2010/0281004 A1 | 11/2010 | Kapoor et al. | |
| 2011/0029569 A1 | 2/2011 | Ganesh et al. | |
| 2011/0219038 A1* | 9/2011 | Behal et al. | 707/794 |
| 2014/0019422 A1* | 1/2014 | Franke et al. | 707/687 |

OTHER PUBLICATIONS

PCT International Search Report and Written Opinion, dated Oct. 11, 2013, for counterpart PCT Application PCT/US2013/038633.

* cited by examiner

*Primary Examiner* — Jensen Hu
(74) *Attorney, Agent, or Firm* — Jennifer R. Davis; Ryan, Mason & Lewis, LLP (57) ABSTRACT

Techniques for encoded data processing which allow for continuous data processing as encoded data changes. Data is decomposed into one or more blocks with each block containing at least one data record. At least one data record within a given block is encoded with a first encoding process selected from one or more encoding processes. The first encoding process is associated with the given data block. Techniques evaluate whether or not to implement an encoding change for a given block when updating a given data record in the given block. Responsive to the evaluation, the given block is re-encoded with a second encoding process. Responsive to the re-encoding, the association of the given block is updated. A map is formed to convert the given data record encoded with the first encoding process to the second encoding process so as to preserve comparative relationships of the given data record.

15 Claims, 7 Drawing Sheets

ENCODED DATA PROCESSING

FIELD

The field of the invention relates to processing data and, more particularly, to techniques for processing encoded data.

BACKGROUND

The efficient processing of large amounts of data is becoming increasingly important as businesses, entities and individuals store and/or require access to growing amounts of data.

Traditional data processing techniques, including conventional database management systems (DBMS) and the current rapid growing unstructured data processing domain, encode data attributes for compacting data storage and efficient searching. Encoding can be applied on a single data attribute (column) or multiple data attributes combined. Encoding a wide range of diverse data into binary format allows for storage savings. Search operations translate search criteria from original predicate values into an encoded binary value, allowing for efficient data comparison and scan.

In today's rapidly growing content serving domains, encoding is typically applied on both raw data such as data contained in relational databases and index data of general content. For example, data contained in relational databases may be column stores, which are typically used for business intelligence and data warehousing workloads.

A particular encoding scheme is usually picked based on data type and values that the storage and search must handle. When the number of distinct data values (i.e., "cardinality") of an attribute is small, a fixed number of binary bits are used to encode distinct values. The goal of such encoding is to reduce storage requirements and reduce bandwidth needed to transfer data between different computer nodes and among different storage hierarchies of a computer system.

SUMMARY

Embodiments of the invention provide techniques for encoded data processing which allow for continuous data processing as encoded data changes.

For example, in one embodiment, a method comprises the following steps. Data is decomposed into one or more blocks with each block containing at least one data record. At least one data record within a given block is encoded with a first encoding process selected from one or more encoding processes. The first encoding process is associated with the given data block. The method evaluates whether or not to implement an encoding change for a given block when updating a given data record in the given block. Responsive to the evaluation, the given block is re-encoded with a second encoding process. Responsive to the re-encoding, the association of the given block is updated. A map is formed to convert the given data record encoded with the first encoding process to the second encoding process so as to preserve comparative relationships of the given data record.

Further embodiments of the invention comprise one or more of the following features.

Upon receiving a request for a search, search code for each encoding process is dynamically generated. Search code for a block is selected based on the encoding process associated with the block, and the search of the block is processed using the selected search code.

Only the given block is transaction locked during re-encoding and updating.

Blocks associated with the first encoding process are re-encoded with the second encoding scheme in a background operation responsive to re-encoding a given block.

The first encoding process is discarded when data records encoded with the first encoding process have been re-encoded with the second encoding process.

Advantageously, one or more embodiments of the invention allow for continuous data processing including insert, update, delete and search of data records as encoded data changes (i.e., increase or decrease in the amount of data, change of existing data, etc.).

These and other embodiments of the invention will become apparent from the following detailed description of illustrative embodiments thereof, which is to be read in connection with the accompanying drawings.

DETAILED DESCRIPTION

Illustrative embodiments of the invention may be described herein in the context of an illustrative method of encoding and processing data in a database. However, it is to be understood that embodiments of the invention are not limited to the illustrative database or methods described but are more broadly applicable to other suitable methods, databases, data storage systems and encoding processes.

As used herein, the phrase "encoding scheme" refers to an encoding process or operation. Also, when referring to a first encoding scheme and a second encoding scheme, the first encoding scheme may employ the same encoding algorithm as the second encoding scheme but just a different version of the encoding algorithm. Alternatively, the first and second encoding schemes may use altogether different encoding algorithms.

Illustrative embodiments provide advantages relative to conventional techniques by utilizing versioning techniques to allow for data growth or change while preventing interruptions to data serving operations. For example, as the amount of data grows and the number of distinct data values increases, the original encoding scheme used to encode the data may no longer be sufficient to handle new data. In such cases, a new encoding scheme with an expanded dictionary should be introduced. Such cases may include but are not limited to a business expanding to a new geographical area, introducing new product types, adding new user groups for online registration, etc.

Conventional techniques for handling an increase in the amount of data require rebuilding a new dictionary and encoding all data with a new encoding scheme. These techniques require an entire or partial database rebuild, which disables the database for on-line applications (search/query and update/insert/delete) for a period of time. Disabling the database for a period of time is disruptive to business operations.

In one or more illustrative embodiments, data is initially encoded using a first encoding scheme (or version) with a first encoding dictionary. To accommodate data growth or change, a new encoding dictionary (and thus a new encoding scheme) is created with increased data diversity. Data may be encoded with either the first or second encoding scheme. Search operations are designed to accommodate such dual-versioning. Data update operations are modified from a single version implementation to accommodate changes in encoding and the transition or migration of encoded data from one version of encoding to another. Though the illustrative embodiments herein are described by means of first and second encoding schemes, the invention is not limited to two encoding schemes but rather extends to a plurality of encoding schemes applying the principles and techniques described herein. As a result, multiple encoding schemes may be active at any time. This approach also enables a gradual growth of storage requirements that is roughly proportional to the number of entries associated with newer dictionary versions.

Figure 1:
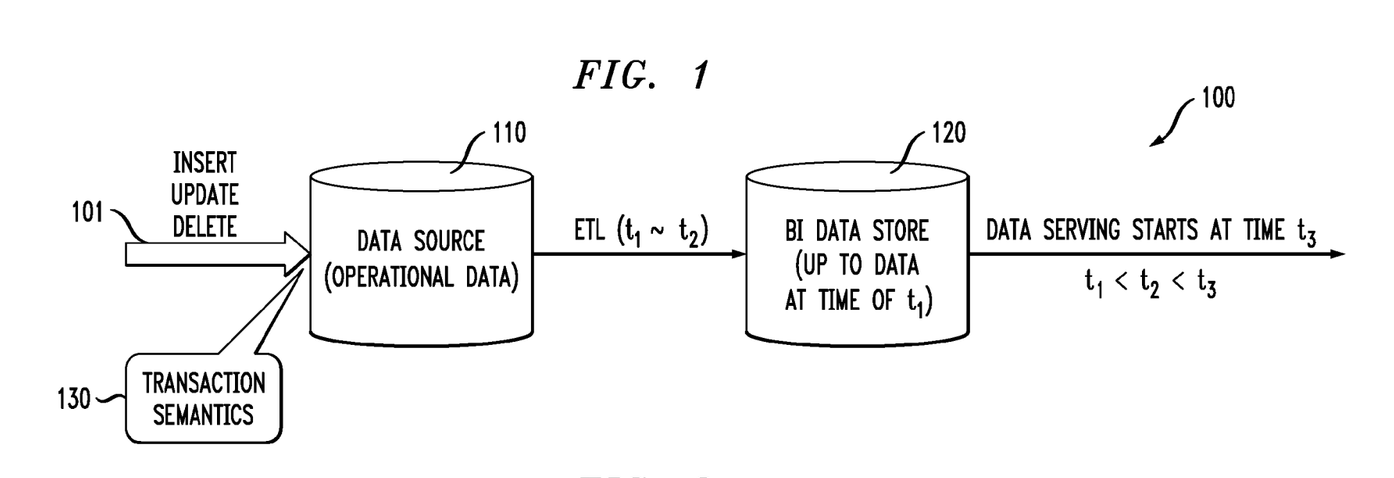
FIG. 1 illustrates a data processing technique.

FIG. 1 is an example of a technique for data processing in a system 100. Instructions 101 to insert data into, update data in, or delete data from a data source 110 governed by transaction semantics 130 are sent to a database. The data source 110 is also known as an operational data store. In conventional techniques, once instructions 101 are sent, the operational data store is transaction locked at time $t_1$. From time $t_1$ to time $t_2$, extract, transform and load (ETL) techniques are applied to the business information (BI) data store 120 as it existed at time $t_1$. After the ETL techniques are completed at time $t_3$, data serving may resume. Typically, $t_1 < t_2 < t_3$.

Figure 2:
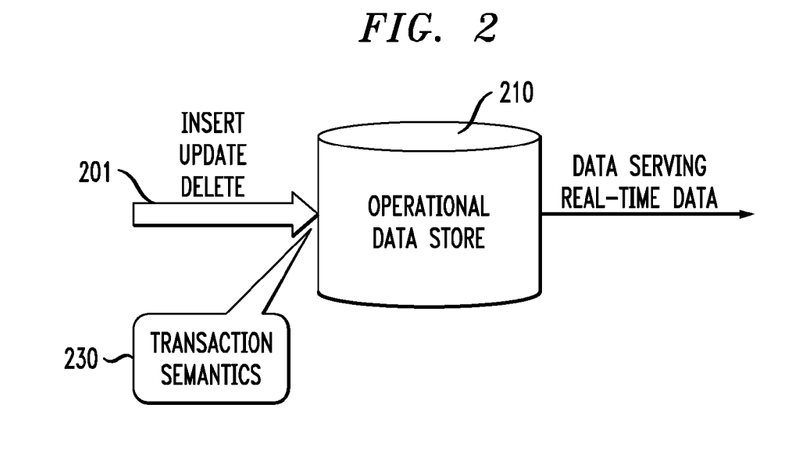
FIG. 2 illustrates a data processing technique, according to an embodiment of the invention.

FIG. 2 is an illustrative embodiment of a data processing technique in a system 200 according to the invention. Instructions 201 to insert data into, update data in, or delete data from an operational data store 210 governed by transaction semantics 230 are sent to a database. Real-time data serving 202 is not affected by instructions 201, as will be detailed below.

For clarity, in the following description, encoding dictionaries specific to a single data attribute or column are described. It is important to note that several data attributes may also be encoded using a single encoding dictionary. Data attributes are encoded based on distinct values. A number of bits are used to represent these values for storage savings. Typically, there is one encoded value for each distinct attribute value. For example, a data attribute corresponding to months of the year may be represented by only four bits. There is a fixed width for the same data attribute across data records. Encoding provides a number of advantages, including efficient implementation of functions (e.g., search) on encoded data. Encoding also allows for efficient implementations of operations such as grouping and sorting. Further compression may be applied to encoded values which takes advantage of data distribution and/or clustering.

According to an illustrative embodiment of the invention, versioning techniques are used to accommodate data growth. As data increases in diversity, cardinality increases. At a certain point, a new encoding scheme with more encoding bits is required to ensure distinct encoding of distinct data values. The "validity" of an encoding scheme is defined as at least one data element being encoded with the encoding scheme. An encoding scheme is no longer valid and can be discarded if all stored data has been encoded using other encoding schemes.

Figure 3:
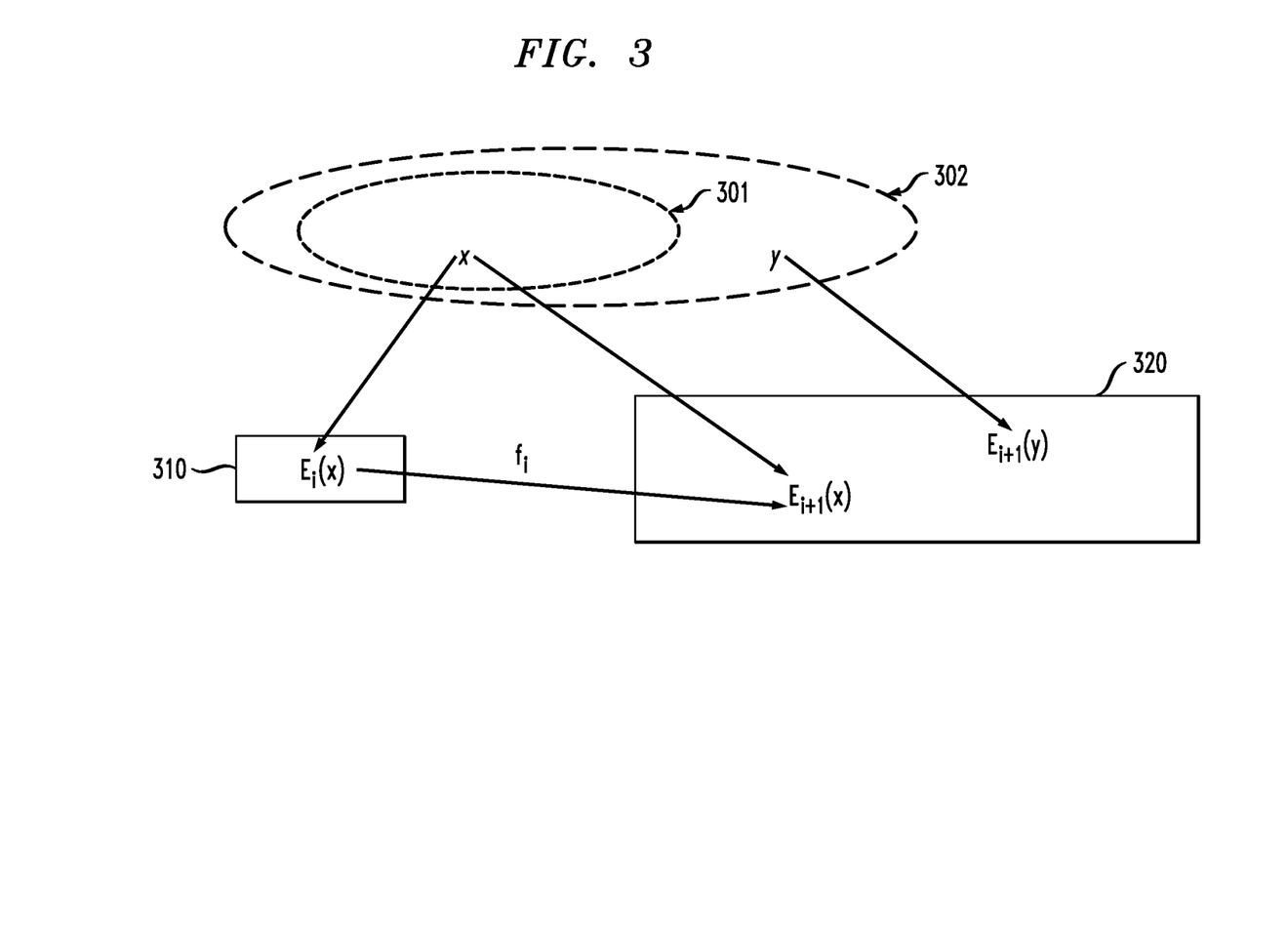
FIG. 3 illustrates a mapping relationship between encoding processes, according to an embodiment of the invention.

While more than one encoding scheme is valid, it is desirable to have certain properties common to each encoding scheme. In order to achieve this desired result, encoding schemes are created which have a mapping relationship. FIG. 3 shows data x 301 encoded with encoding scheme $E_i$ 310 and data y encoded with encoding scheme $E_{i+1}$ 320. Preferably, a mapping relationship exists such that for a value x encoded to value $x_i = E_i(x)$ using encoding scheme i and value $x_{i+1} = E_{i+1}(x)$ using encoding scheme i+1, $x_{x+1} = f_i(x_i)$. The mapping operation $f_i$ can be one of arithmetical, logical, a bit-wise operation, etc. or any combination thereof.

In addition, it is desirable to maintain comparative relationships among data values. When comparative operators, in contrast to exact match operators, are deployed on a column, each encoding scheme must continue to satisfy the proper comparative results. More specifically, for given raw data values v and w, a comparative relationship v<w in the raw data values should imply the same comparative relationship for their encoded values, i.e. $E_k(v) < E_k(w)$. The advantage of this property is that comparative predicate on raw data values can be directly translated to encoded values.

Figure 4:
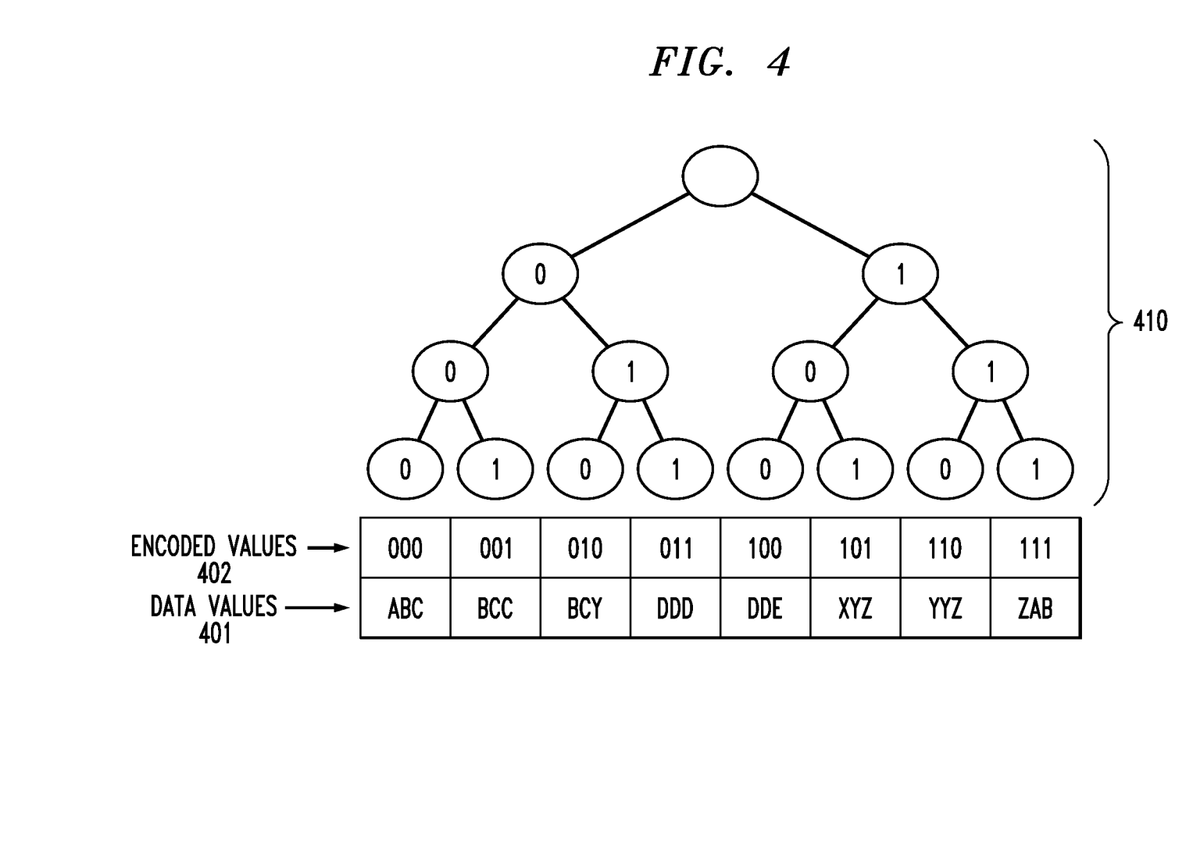
FIG. 4 illustrates an example of data values encoded using an encoding process, according to an embodiment of the invention.
Figure 5:
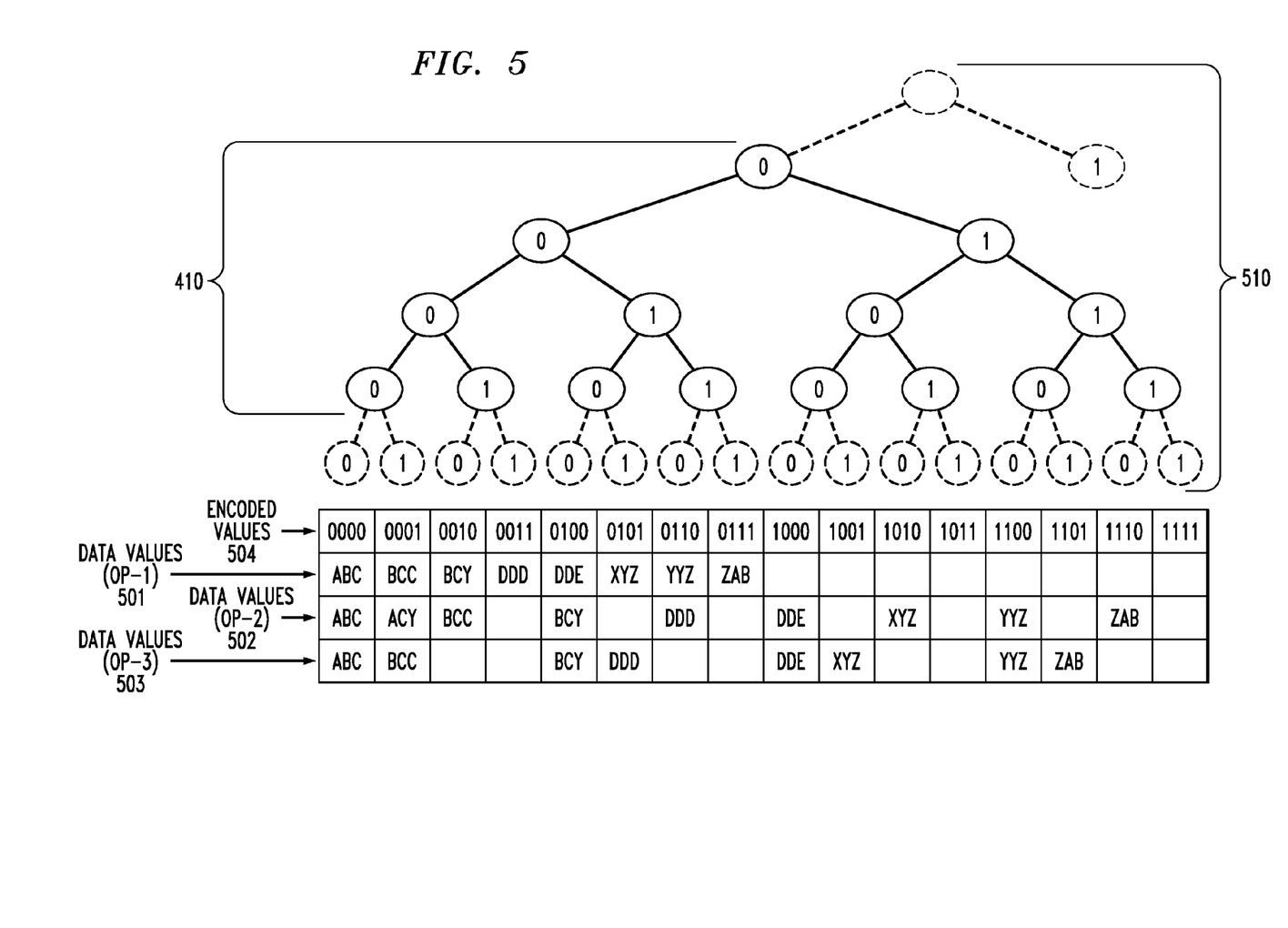
FIG. 5 illustrates mapping processes for data values, according to an embodiment of the invention.

FIGS. 4 and 5 illustrate one way in which the mapping relationship detailed above may be implemented. FIG. 4 shows data values 401 mapped to corresponding encoded values 402 using a 3-bit encoding. For example, data value ABC is encoded as 000. Data growth may cause the amount of data values to increase, requiring a second encoding scheme. FIG. 5 shows data values 501 encoded using an encoding scheme op-1 where data values 401 are encoded by prefixing a 0-bit to the encoded values 402. Encoding scheme op-2 encodes data values 502 by suffixing a 0-bit to encoded values 402. Encoding scheme op-3 encodes data values 503 by inserting a 0 in the third bit from the left for encoded values 402. As shown in FIG. 5, each of the encoding schemes maintains comparative predicate on data values 401.

In an illustrative embodiment of the invention, there is no need to physically separate two encoding dictionaries. As shown in FIGS. 4 and 5, the tree 510 includes tree 410. The dashed lines in tree 510 represent portions added to tree 410. Depending on how the storage layout is designed for the two (or more) dictionaries, there is no need for physically separate dictionaries. There is a need, however, to logically maintain two or more dictionaries. A particular data value may be encoded by a first or a second dictionary. For example, data value BCC is encoded as 001 in the encoding scheme of FIG. 4. As shown in FIG. 5, the same data value BCC may also be encoded as 0001 in encoding scheme op-1 or 0010 in encoding scheme op-2. For query performance, the same encoding length is used for a block of data when in-place update as opposed to appending occurs. If the encoded value in a second encoding scheme can be obtained by applying a function on the previous encoding (e.g., op-1, op-2 and op-3), physical storage of new encoding of existing values is not required.

To transform range predicate directly from raw data values to encoded data values, encoding schemes need to maintain encoded value order. In addition, it may be necessary to insert new raw data values between existing raw data values. Encoding schemes op-1, op-2 and op-3 as shown in FIG. 5 illustrate these properties. For example, new raw data value ACY falls between ABC and BCC in encoding scheme op-2.

In an illustrative embodiment, two or more encoding dictionaries are physical stored. An advantage of storing two physical dictionaries is that one dictionary will gradually phase out if all blocks are re-encoded using a second dictionary. In this embodiment, there is no need to merge dictionaries.

In other illustrative embodiments, the order preserving characteristics and techniques described above may not be necessary. For example, if a particular database does not require more efficient query range predicate or dictionary look-up, the above detailed order preserving characteristics and techniques do not need to be implemented.

In addition, while the above described illustrative embodiments detail the more common scheme of dictionary expansion due to data growth, the opposite may also be desired. If there is a need to reduce the encoding size, the versioning technique described herein still applies. In the case of dictionary contraction, however, there may not be a simple mapping relationship to convert from an encoding scheme with a large dictionary to a new encoding scheme with a smaller dictionary. In this case, dictionary look-up may be required to re-encode existing data entries. Blocks may be merged to contract space under the new encoding scheme with the smaller dictionary.

Figure 6:
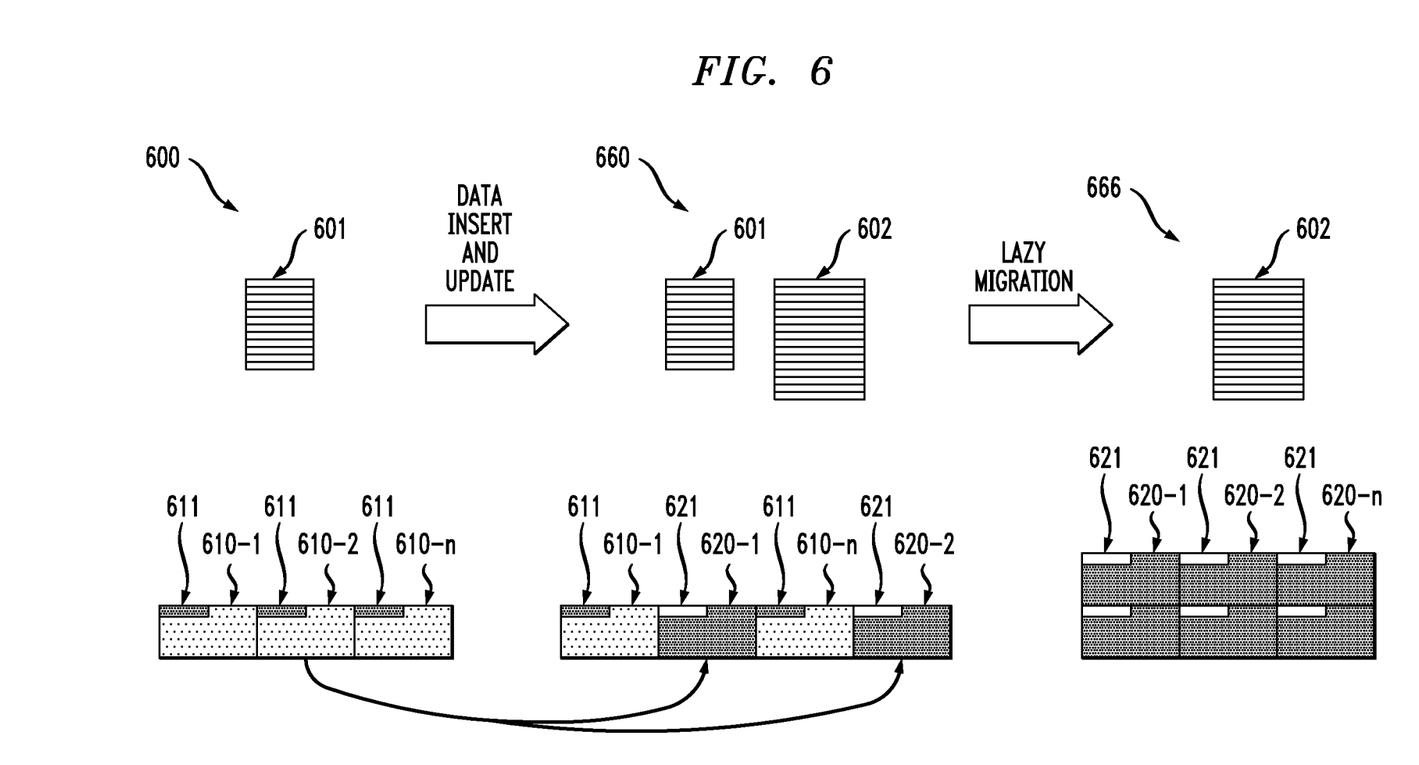
FIG. 6 illustrates re-encoding of data blocks, according to an embodiment of the invention.

FIG. 6 shows how data blocks are re-encoded according to an embodiment of the invention. A first dictionary 601 is used to encode data blocks 610-1 to 610-n. Each data block 610-1 to 610-n has corresponding metadata information 611, used to associate dictionary 601 with these blocks. In portion 600 of FIG. 6, all data blocks 610 are encoded with a first encoding scheme using dictionary 601. Responsive to an insert, update or delete instruction, the database may simply append data entries to one of the existing blocks 610. If newly inserted or updated data cannot be accommodated using the first dictionary 601, the database is updated as shown in portion 660.

In portion 660, a particular block 610-2 is re-encoded to blocks 620-1 and 620-2 with a second encoding scheme using a second dictionary 602. Blocks 620-1 and 620-2 have corresponding metadata information 621 associating the second encoding scheme with these blocks. Note that FIG. 6 illustrates an embodiment where a block 610-2 is split into two blocks 620-1 and 620-2. It is to be appreciated that numerous other configurations are possible. For example, block 610-2 could be split into three or more blocks, or may not be split at all. Since the second encoding scheme uses more bits for storage, it is likely that block 610-2 cannot accommodate all the existing entries. To resolve this constraint, a block split operation is performed. During block split, one or more new blocks are allocated and entries based on the second encoding scheme are spread among the new blocks. If data consistency is important for search operations, an exclusive latch might be applied on the blocks processed during the block split operation before all data entries are re-populated on the blocks.

As shown in portion 666 of FIG. 6, the remaining blocks 610 are lazily converted from the first encoding scheme to the second encoding scheme. This lazy conversion is performed as a background operation. Once all the blocks 610 have been converted to the second encoding scheme, the first encoding dictionary 601 may be discarded.

Figure 7:
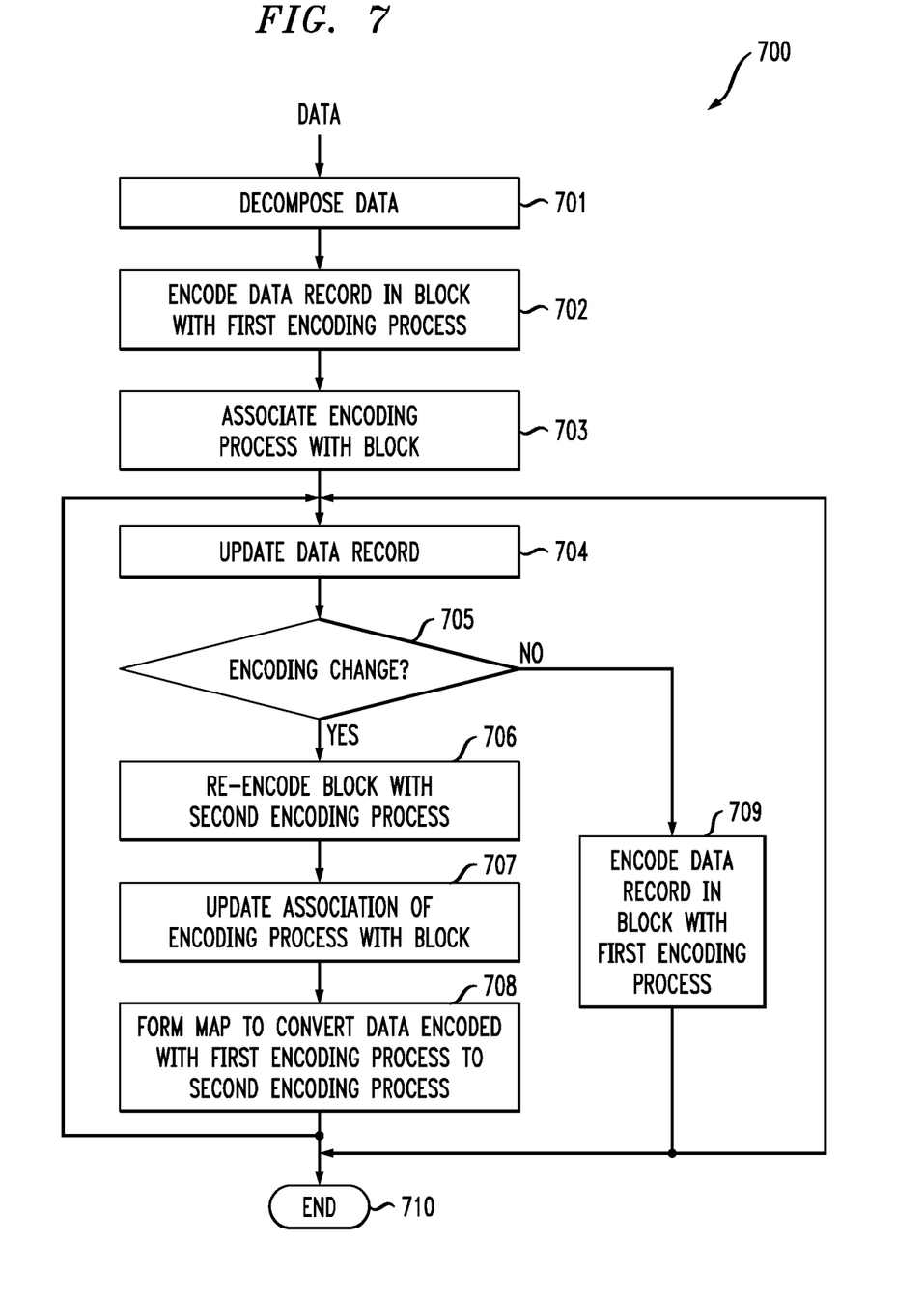
FIG. 7 illustrates a methodology of encoding data, according to an embodiment of the invention.

FIG. 7 illustrates an encoding methodology 700 in an embodiment of the invention. Data is received and decomposed 701. For example, received data may comprise business information organized into one or more tables. Each table may be decomposed into its own block, or one table may be decomposed and split among several blocks. Each of the blocks contains at least one data record. If a given block contains all or part of a table, each data record may be a row of the table or a column of a row of a table. It should be understood that many other arrangements are possible and that received data is not limited to tables but rather may comprise various other types of information to be stored in databases, data storage systems, etc.

Data records within a given block are encoded 702 with a first encoding scheme selected from one or more encoding schemes. In certain embodiments, step 702 may encode all data records within a given block with the same encoding scheme. In one embodiment, step 702 encodes all blocks within the same spatial locality region with the same encoding scheme. After the encoding step 702, the first encoding scheme is associated 703 with the given block. When an instruction 704 is made to update the data record, the methodology evaluates 705 whether or not to re-encode a given block containing the data record to be updated. It is important to note that instruction 704 to update the data record should be construed broadly to include such operations as updating or modifying data in an existing data record, adding new data to an existing data record, adding new data in a new data record, deleting an existing data record, etc.

If the methodology determines in step 705 to implement an encoding change, the given block is re-encoded 706 with a second encoding scheme. In certain embodiments, the second encoding scheme is created in response to the evaluation 705. In other embodiments, the second encoding scheme may already exist and thus does not need to be created in response to the evaluation 705. After the given block is re-encoded with the second encoding scheme, the association of the given block is updated 707 to reflect the encoding change. In step 708, a map is formed to convert data encoded with the first encoding scheme to the second encoding scheme. The methodology will then loop back if a new instruction 704 is received, otherwise the process ends 710.

If the methodology determines in step 705 not to implement an encoding change, the data record in the given block is encoded 709 using the first, or existing, encoding scheme. The methodology will then loop back if a new instruction 704 is received, otherwise the process ends 710.

In the above-described embodiments, only the given block which is re-encoded is transaction locked. In contrast, conventional arrangements lock the entire database to transition from one encoding scheme to another. Thus, embodiments of the invention advantageously provide for continued data processing as encoded data changes.

A particular database may be configured in a number of ways once a second encoding scheme is used for a block. Generally, however, a given encoding scheme is used for data within the same spatial locality region. In one embodiment, for each insert, update or delete instruction sent to the database after the second encoding scheme is initially utilized, each block affected by the instruction will be re-encoded using the second encoding scheme regardless of whether the newly inserted or updated data can be accommodated using the existing encoding scheme for that block. Referring to FIG. 7, in this embodiment the evaluating step 705 will implement an encoding change and perform steps 706-708. In this embodiment, all blocks will eventually be encoded using the second encoding scheme without employing the lazy conversion discussed above. A tracking program can be used to track which blocks are encoded with particular encoding schemes to facilitate phasing out invalid dictionaries. In another embodiment, only blocks which cannot accommodate newly inserted or updated data are re-encoded using the second encoding scheme. Again referring to FIG. 7, in this embodiment the evaluating step 705 will implement an encoding change and perform steps 706-708 only if a given block cannot accommodate instruction 704. Illustrative embodiments of the invention also accommodate query and search processing of the database.

Figure 8:
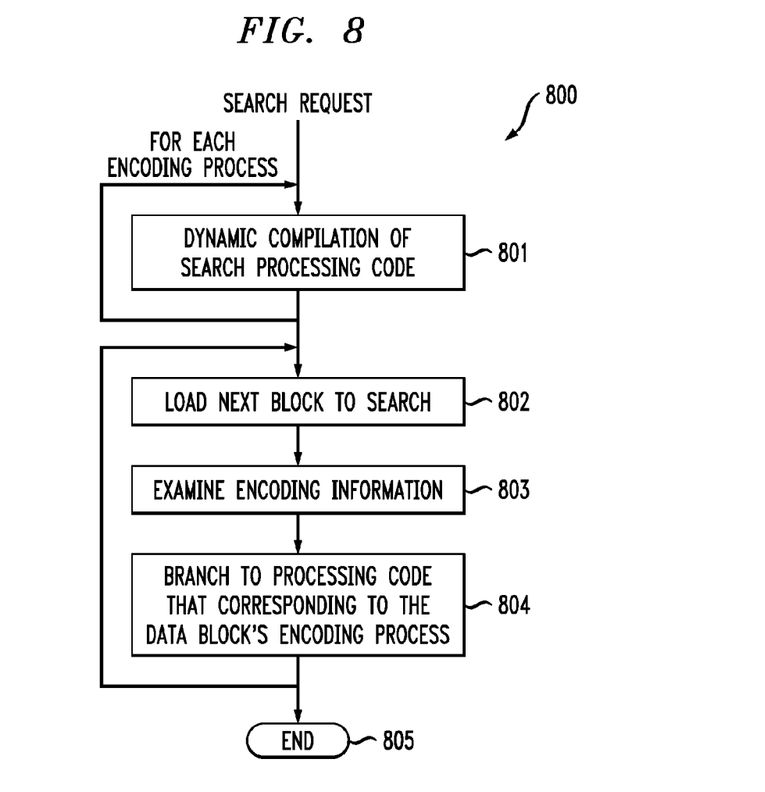
FIG. 8 illustrates a methodology of performing search operations, according to an embodiment of the invention.

FIG. 8 illustrates a search methodology 800 in an embodiment of the invention. During the prepare phase for a search, the evaluation criteria or predicate is examined and predicate values are translated into encoded values if the data attributes are stored in encoded format so that a search can be processed without decoding data records. Upon receiving a search request, specific search code is generated 801 for each encoding scheme. Thus, when multiple encoding schemes are in use, multiple versions of search processing code are generated. The search begins with loading a block to search 802. The metadata information of the loaded block is examined 803 to determine the encoding scheme used for that block. The search code generated for the encoding scheme associated with the loaded block is selected 804 and the loaded block is searched. The process then loops back and loads the next block to search. Steps 802-804 are performed for each block. Once all blocks have been searched, the search is finished 805. Considering the large volume of data processed in data warehousing and analytics query environments or in large content web searching environments, the added performance overhead of generating multiple search processing codes and selecting the right code version upon inspecting a data block is negligible.

It is important to note that one or more steps in FIGS. 7 and 8 may be performed in parallel or in a different order. For example, steps 702 and 703 in FIG. 7 may be performed substantially simultaneously. Step 703 may also be performed before step 702. Numerous other examples apply to the various steps in FIGS. 7 and 8.

As will be appreciated by one skilled in the art, aspects of the present invention may be embodied as a system, apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be but are not limited to, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring again to FIGS. 2-8, the diagrams in the figures illustrate the architecture, functionality, and operation of possible implementations of systems, methods and computer program products according to various embodiments of the present invention. In this regard, each block in a flowchart or a block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

Accordingly, techniques of the invention, for example, as depicted in FIGS. 2-8, can also include, as described herein, providing a system, wherein the system includes distinct modules (e.g., modules comprising software, hardware or software and hardware).

Figure 9:
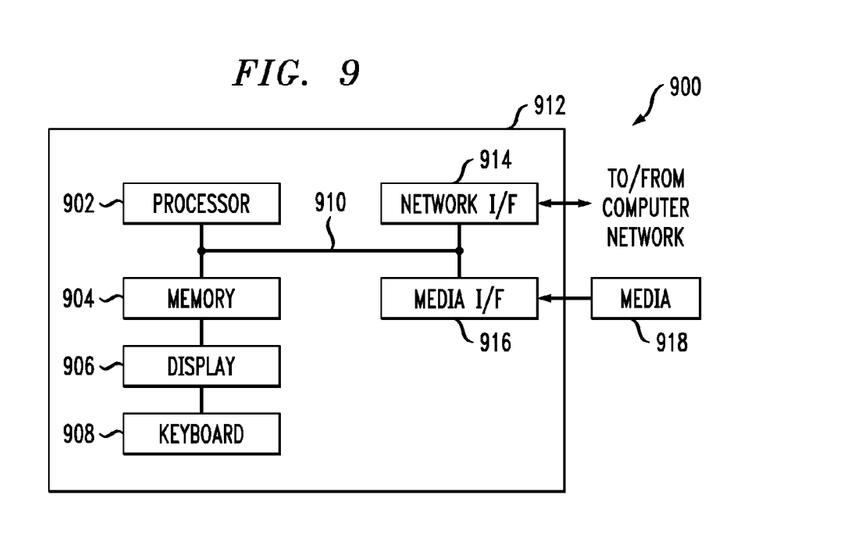
FIG. 9 illustrates a computing device in accordance with which one or more components/steps of techniques of the invention may be implemented, according to an embodiment of the invention.

One or more embodiments can make use of software running on a general purpose computer or workstation. With reference to FIG. 9, such an implementation 900 may employ, for example, a processor 902, a memory 904, and an input/output interface formed, for example, by a display 906 and a keyboard 908. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to optionally include, for example, one or more mechanisms for inputting data to the processing unit (for example, keyboard or mouse), and one or more mechanisms for providing results associated with the processing unit (for example, display or printer).

The processor 902, memory 904, and input/output interface such as a display 906 and keyboard 908 can be interconnected, for example, via bus 910 as part of data processing unit 912. Suitable interconnections, for example, via bus 910, can also be provided to a network interface 914, such as a network card, which can be provided to interface with a computer network, and to a media interface 916, such as a diskette or CD-ROM drive, which can be provided to interface with media 918.

A data processing system suitable for storing and/or executing program code can include at least one processor 902 coupled directly or indirectly to memory elements 904 through a system bus 910. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboard 908 for making data entries; display 906 for viewing data; a pointing device for selecting data; and the like) can be coupled to the system either directly (such as via bus 910) or through intervening I/O controllers (omitted for clarity).

Network adapters such as a network interface 914 may also be coupled to the system to enable the data processing system to become coupled to other data processing systems or remote printers or storage devices through intervening private or public networks. Modems, cable modem and Ethernet cards are just a few of the currently available types of network adapters.

As used herein, a "server" includes a physical data processing system (for example, system 912 as shown in FIG. 9) running a server program. It will be understood that such a physical server may or may not include a display and keyboard. Further, it is to be understood that components may be implemented on one server or on more than one server.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method, comprising:
   decomposing data into one or more blocks, each block containing at least one data record;
   encoding the at least one data record within a given one of the one or more blocks with a first encoding process selected from one or more encoding processes;
   associating the first encoding process with the given block;
   evaluating whether or not to implement an encoding change for the given block containing a given data record when updating the given data record, wherein updating the given data record comprises at least one of inserting data into, updating data in, and deleting data from the given data record;
   re-encoding the given block containing the given data record with a second encoding process responsive to said evaluating step;
   updating the association of the given block responsive to said re-encoding step; and
   forming a map to convert the given data record encoded with the first encoding process to the second encoding process;
   wherein the given data record encoded with the first encoding process has one or more comparative relationships with one or more other data records encoded with the first encoding process; and
   wherein the map is formed so as to preserve, for the given data record encoded with the second encoding process, the one or more comparative relationships of the given data record encoded with the first encoding process.

2. The method of claim 1, wherein the given block is transaction-locked during said re-encoding and updating steps.

3. The method of claim 1, wherein the first encoding process is discarded when the data records encoded with the first encoding process have been re-encoded with the second encoding process.

4. The method of claim 1, wherein blocks associated with a first encoding process not already re-encoded with the second encoding process are re-encoded with the second encoding process in a background operation responsive to said re-encoding step.

5. The method of claim 1, wherein a given one of the one or more encoding processes is used to encode data within the same spatial locality region.

6. The method of claim 1, further comprising the step of utilizing one or more search operations associated with a block based on the encoding process associated with the block.

7. The method of claim 1, wherein a given one of the one or more encoding processes is used on more than one block.

8. The method of claim 1, wherein the given block is split when the given block does not provide storage under the second encoding process.

9. The method of claim 1, wherein said evaluating step is based on whether the first encoding process has enough encoding bits to represent an updated data record.

10. The method of claim 1, wherein data records in the given block are encoded with the same encoding process.

11. The method of claim 1, wherein the second encoding process is created responsive to said evaluating step.

12. The method of claim 1, further comprising the steps of:
receiving a request for a search;
dynamically generating a search code for each encoding process;
selecting the search code for a block based on the encoding process associated with the block; and
processing the search on the block using the selected search code.

13. The method of claim 12, wherein the search can be processed without decoding data records.

14. The method of claim 12, wherein a search code is generated for a given encoding process when at least one data record is encoded with the given encoding process.

15. The method of claim 1, wherein the map is formed by applying at least one of a logical operation, a bit-wise operation and an arithmetical operation on the given data record.

* * * * *